(12) United States Patent
Dean et al.

(10) Patent No.: US 12,324,127 B2
(45) Date of Patent: Jun. 3, 2025

(54) FOLDED-FIN VAPOR CHAMBER COLD PLATE

(71) Applicant: HEWLETT PACKARD ENTERPRISE DEVELOPMENT LP, Houston, TX (US)

(72) Inventors: Steven Dean, Chippewa Falls, WI (US); Ernesto J. Ferrer, Aguadilla, PR (US); John Paul Franz, Tomball, TX (US); Laura Malcotti-Sanchez, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 303 days.

(21) Appl. No.: 17/867,873

(22) Filed: Jul. 19, 2022

(65) Prior Publication Data

US 2024/0032249 A1    Jan. 25, 2024

(51) Int. Cl.
*F28D 15/02* (2006.01)
*F28D 15/04* (2006.01)
*H05K 7/20* (2006.01)

(52) U.S. Cl.
CPC ..... *H05K 7/20327* (2013.01); *H05K 7/20336* (2013.01)

(58) Field of Classification Search
CPC .. F28D 15/0275; F28D 15/046; F28D 1/0426; F28D 7/0083; H01L 23/473; H01L 23/427; H05K 7/20336; H05K 7/2039; F28F 13/12
See application file for complete search history.

(56) References Cited

U.S. PATENT DOCUMENTS

| | | | | |
|---|---|---|---|---|
| 6,269,866 | B1* | 8/2001 | Yamamoto | F28D 15/0233 174/15.2 |
| 8,014,150 | B2* | 9/2011 | Campbell | H05K 7/20809 165/185 |
| 2005/0173096 | A1* | 8/2005 | Hsu | H01L 23/427 165/104.21 |
| 2006/0162903 | A1* | 7/2006 | Bhatti | F28F 3/12 165/104.21 |

(Continued)

OTHER PUBLICATIONS

Gernert et al., "Three Dimensional Heat Pipe Vapor Chamber Design and Performance," 18th IEEE ITHERM Conference, Jul. 11, 2019, 4 pages.

(Continued)

*Primary Examiner* — Frantz F Jules
*Assistant Examiner* — Jason N Thompson
(74) *Attorney, Agent, or Firm* — Jones Robb PLLC

(57) ABSTRACT

A heat removal apparatus may comprise a vapor chamber device and a cover coupled to the vapor chamber device. The vapor chamber device comprises a base, a folded fin structure coupled to the base, with the base and folded fin structure defining a vapor chamber containing a wick and a working fluid. The cover and the vapor chamber device define a liquid chamber configured to receive liquid coolant. The folded fin structure comprises a plurality of folded fins defining a first plurality of grooves on a first side of the folded fin structure and defining a second plurality of grooves on a second side of the folded fin structure. The first plurality of grooves are part of the vapor chamber. The second plurality of grooves are part of the liquid chamber.

20 Claims, 7 Drawing Sheets

(56) References Cited

U.S. PATENT DOCUMENTS

| | | | |
|---|---|---|---|
| 2006/0213648 A1* | 9/2006 | Chen | H01L 23/427 165/104.33 |
| 2010/0128436 A1* | 5/2010 | Edmunds | F28D 15/0233 165/104.26 |
| 2012/0018134 A1* | 1/2012 | Polk, Jr. | F28F 3/04 165/170 |
| 2012/0313526 A1* | 12/2012 | Lee | F21K 9/00 315/113 |
| 2016/0227672 A1* | 8/2016 | Lin | H05K 7/20254 |
| 2020/0029466 A1* | 1/2020 | Long | H05K 7/20309 |
| 2020/0100396 A1* | 3/2020 | Iyengar | H05K 7/20254 |
| 2020/0326134 A1* | 10/2020 | Chen | H01L 23/427 |
| 2021/0013390 A1 | 1/2021 | Vanderwees et al. | |
| 2021/0112686 A1* | 4/2021 | Dogruoz | H01L 23/427 |
| 2021/0136956 A1 | 5/2021 | Paavola et al. | |
| 2021/0180873 A1 | 6/2021 | Lin et al. | |

OTHER PUBLICATIONS

Yuan et al., "Two-Phase Vapor Chambers with Micropillar Evaporators: A New Approach to Remove Heat from Future High-Performance Chips", 18th IEEE ITHERM Conference, Jul. 11, 2019, 9 pages.

* cited by examiner

FOLDED-FIN VAPOR CHAMBER COLD PLATE

INTRODUCTION

Electronic devices, such as computers, networking devices, power supply units, etc., generate heat when in use. Cooling systems may be utilized to remove heat from components of the electronic devices to keep them within desired operating temperatures. For example, liquid cooling techniques may use flows of liquid coolant to remove heat from the system. In such liquid cooling techniques, a cold plate can be used to transfer heat from the electronic device to the liquid cooling. The cold plate can be thermally coupled with the electronic device and the flow of liquid coolant. For example, some cold plates may have protrusions (e.g., fins, pins, or other similar heat exchange surface elements) that extend into the flow of liquid coolant, thus allowing the cold plate to absorb heat from the component and dissipate the heat into the liquid coolant in contact with the protrusions.

Additional types of thermal devices for transferring heat include heat pipes and vapor chamber devices. In heat pipes and vapor chamber devices, a sealed vapor chamber is defined by a set of walls and a working fluid is disposed in the vapor chamber. The working fluid goes through a repeating phase change cycle of vaporization, convection, condensation, and wicking to transfer heat from a hot side of the device (e.g., a side thermally coupled with a heat generating component) to a colder side of the device (e.g., a side thermally coupled with a cold plate). This phase change cycle enables the working fluid in a heat pipe or vapor chamber device to transfer heat at rates that greatly exceed those possible from conduction through solid metal devices having a similar size and shape as the heat pipe or vapor chamber device.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operation. In the drawings.

DETAILED DESCRIPTION

Figure 1:
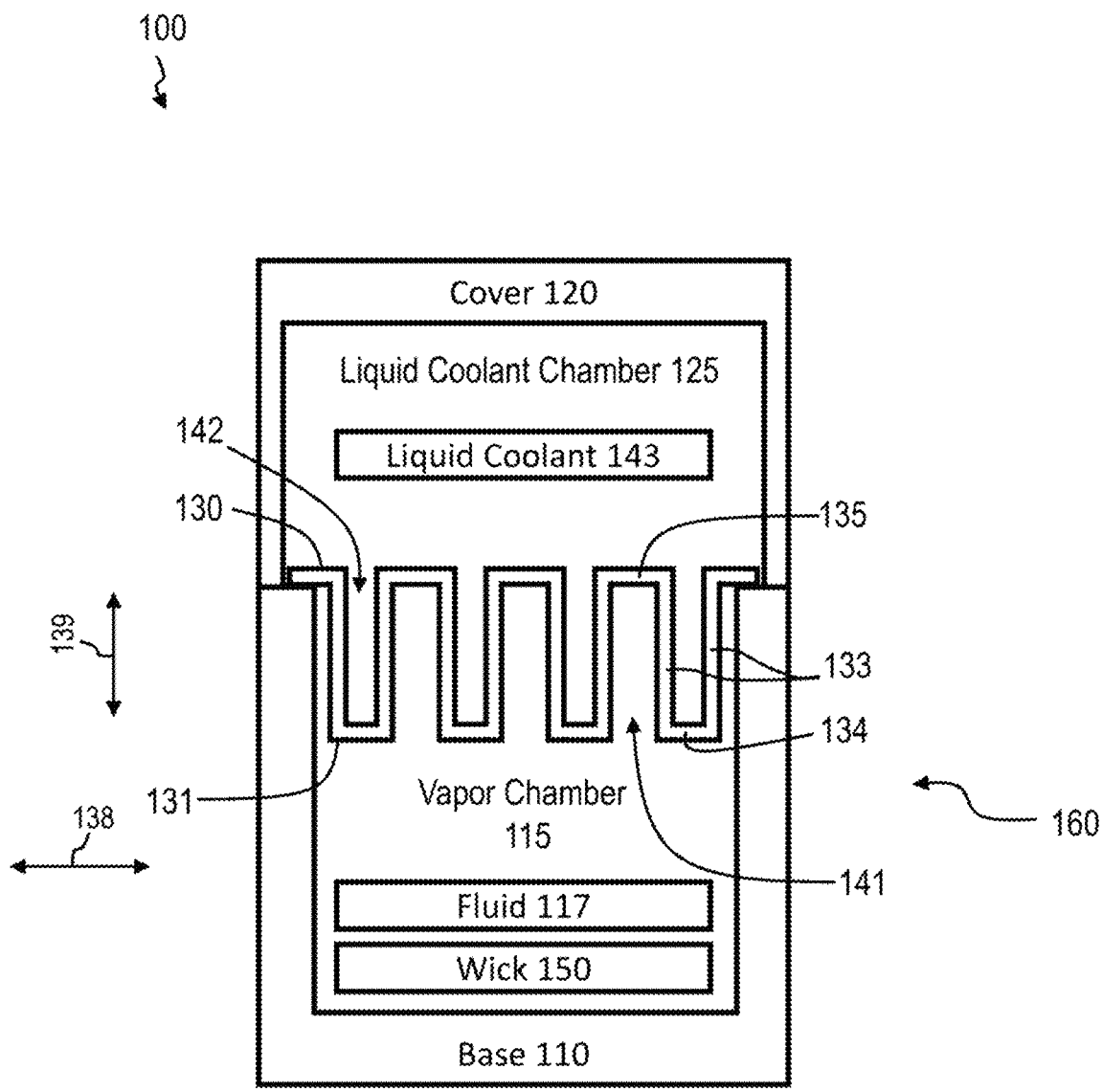
FIG. 1 is a block diagram illustrating a folded fin vapor chamber cold plate.

The term "cold plate" is sometimes used in the art with varying meanings, with some meanings being more generic and others being more specific. As used herein "cold plate" refers specifically to a subset of thermal devices that are configured to receive heat from a component via conduction and to dissipate that heat into a flow of liquid coolant (e.g., water), in contrast to a "heat sink" which as used herein refers specifically to a subset of thermal devices that are configured to receive heat from a component via conduction and dissipate that heat into gas (e.g., air).

Some electronic devices, such as high-performance computers for example, generate substantial amounts of heat. Moreover, as electronic devices become faster and more powerful in the future, it is expected that they will generate even more heat. Such high heat output can make it difficult to remove heat at an adequate rate from heat generating components. In addition, in certain contexts stricter limitations are being imposed on cooling systems, such as requiring a higher inlet water temperature and/or lower pressures for liquid cooled systems, and these limitations can make it even more difficult for existing thermal devices to remove heat at desired rates.

In the case of cooling techniques utilizing cold plates, some cold plates may not have sufficiently high heat transfer rates to keep up with expected amounts of heat output while also satisfying the limitations increasingly being imposed on cooling systems. Some cold plates comprise a set of relatively high surface area protrusions (e.g., fins, pins, and other types of protrusions with relative high surface area) that extend from a common base into a flow of liquid coolant. The common base may be thermally coupled with the heat generating component and thus heat is transferred from the component into the base via conduction. Then, the heat is transferred via conduction through a thickness of the base into an attached end of the protrusions, then through the protrusions along a height dimension thereof (a dimension extending from the attached end thereof toward a free end thereof), and from the protrusions into the liquid coolant. However, the rate of conductive heat transfer through the base and through the height dimension of the protrusions may limit the overall heat transfer rate of the cold plate, and thus in some cases the overall rate of heat transfer may be insufficient to allow for desired operating temperatures.

To address the challenges associated with removing heat from electronic devices, examples disclosed herein may utilize a folded fin vapor chamber cold plate capable of a relatively high rate of heat transfer. The folded fin vapor chamber cold plate comprises a base, a folded fin structure coupled to the base, and a cover coupled to the base and/or folded fin structure. The folded fin structure comprises a plurality of folded fins, which define a first set of grooves on the side of the folded fin structure that faces the base (hereinafter the "base side") and a second set of grooves on the other side of the folded fin structure that faces the cover (hereinafter the "cover side"). The base and the folded fin structure are coupled together and define a sealed vapor chamber therebetween. A working fluid and a wicking structure (also referred to herein as a "wick") are disposed within the vapor chamber, and the working fluid is configured to transfer heat from the base (which may be thermally coupled to a heat generating component) into the folded fins via a phase change cycle such as described above. Thus, the base, the folded fin structure, the wick and the working fluid form a vapor chamber device, which is one part of the folded fin vapor chamber cold plate. The cover is coupled to this vapor chamber device (e.g., to the base and/or the folded fin structure) such that a liquid coolant chamber is defined between the cover and the folded fin structure (i.e., the cover side of the folded fin structure). Liquid coolant may be flowed through this liquid coolant chamber, with the liquid coolant flowing through the second set of grooves defined by the folded fins on the cover side of the folded fin structure. Thus, liquid coolant is able to contact the folded fins and remove heat therefrom.

In some implementations, turbulators may also be provided in the liquid coolant chamber to introduce turbulence into the flow of liquid coolant. This turbulence allows for increased rates of heat transfer between the folded fins and the liquid coolant (turbulent flows of liquid tend to remove more heat from the folded fins than laminar flows do, all other things being equal). The turbulators may be, in some implementations, protrusions (e.g., blades) that protrude downward from the cover into the grooves defined by the folded fins. In other implementations, the turbulators may include surface features of the folded fins themselves on the cover side thereof that are designed to introduce turbulence.

Notably, in the folded fin vapor chamber cold plate, the vapor chamber extends into the first set of grooves defined by the folded fins on the base side of the folded fin structure. In other words, the first set of grooves (i.e., the open spaces between adjacent portions of the folded fins on the base side of the folded fin structure) are part of the vapor chamber, and these spaces are communicably connected with one another and with the other parts of the vapor chamber such that vapor in the vapor chamber can flow into each of these spaces. As a result, the surfaces of the folded fins on the base side are exposed directly to the vapor chamber and vapor within the vapor chamber can directly contact and condense on these surfaces of the folded fins. Because vapor can condense directly onto the surfaces of the folded fins on the base side of the folded fin structure, heat carried by the vapor can be transferred directly into the folded fins along the entirety thereof. This direct transfer of heat into the fins by the vapor allows for a much greater rate of heat transfer than would be possible via conduction alone. More specifically, the folded fin vapor chamber device may have a higher overall rate of heat transfer between the heat generating component and the folded fins than would be possible with other cold plates at least because the folded fin vapor chamber device omits some of the relatively slow conduction paths of the overall heat transfer pathway—such as, for example, conduction through a common base coupled to the fins and conduction through the fins themselves—and replaces these relatively slow conduction paths with the much faster heat transfer by the working fluid. As a result of the increased rate of heat transfer into the folded fins, the cold plate incorporating the folded fin vapor chamber device may be able to relatively efficiently cool high-powered components even with the use of relatively high liquid coolant temperatures or other limitations on parameters of the overall cooling system. For example, some implementations of the cold plate may have a thermal resistance of or better, where thermal resistance refers to the difference between the temperature of the component to be cooled and the temperature of the liquid coolant (also referred to as the temperature delta) in degrees Celsius all divided by the rate at which the cold plate can remove heat from the component to be cooled in Watts under the aforementioned temperature conditions. A lower thermal resistance allows the cold plate to either remove more heat at a given coolant temperature or to remove a given amount of heat at higher coolant temperatures (or some combination of these). For example, with a thermal resistance of 0.01° C./W, a cold plate could in theory remove, for example, 2000 W of heat at a 20° C. temperature delta, 1500 W at a 15° C. temperature delta, 1000 W of heat at a 10° C. temperature delta, and so on. In contrast, a cold plate with double the thermal resistance (e.g., 0.02° C./W) would remove half as much heat at the same temperature deltas, or would require twice as large of temperature deltas (i.e., colder coolant) in order to remove the same amounts of heat.

In addition to allowing for higher heat transfer rates, a folded fin vapor chamber cold plate may also allow for a reduced pressure drop across the cold plate (e.g., a pressure drop between an inlet into the liquid coolant chamber of the cold plate and an outlet thereof) as compared to other cold plates. This may occur because, in the folded fin vapor chamber cold plate, the grooves defined by and between the folded fins may be relatively wide in comparison to the width of grooves defined between consecutive fins in other cold plates. For example, some cold plates may utilize skived fins, and widths of the grooves between such skived fins have advanced to be progressively smaller, for example around approximately 200 micrometers in some cases. In contrast, the folded fins of the folded fin vapor chamber cold plate may have relatively wide grooves, for example around 2.5 mm in some examples. The wider grooves of the folded fins produce less impedance to the flow of liquid coolant through the liquid coolant chamber, and therefore the pressure drop created by the cold plate is reduced. For example, in some cases the pressure drop across the cold plate may be around 1.5 times to 5 times smaller than that which would occur in other types of cold plates of similar size having skived fins. For example, in some implementations the pressure drop across the cold plate may less than or equal to 1 psi (6.9 kPa). In some implementations, this reduction in pressure drop may be attained notwithstanding the presence of turbulators protruding into the grooves. The reduced pressure drop across the cold plate may allow for the liquid cooling loop that supplies liquid coolant to the cold plate to operate with lower supply pressures, which may allow for reduced power usage by pumps of the system and/or allow for usage of components (e.g., pumps, fittings, etc.) that are rated for lower pressures (which may be less expensive) while still providing sufficient performance.

Turning now to the figures, various devices, systems, and methods in accordance with aspects of the present disclosure will be described.

FIG. 1 is a block diagram conceptually illustrating a heat removal apparatus in the form of a folded fin vapor chamber cold plate 100 referred to also as "cold plate 100". It should be understood that FIG. 1 is not intended to illustrate specific shapes, dimensions, or other structural details accurately or to scale, and that implementations of the cold plate 100 may have different numbers and arrangements of the illustrated components and may also include other parts that are not illustrated.

As shown in FIG. 1, the cold plate 100 comprises a base 110, a cover 120, and a folded fin structure 130. The base 110 and the folded fin structure 130 are coupled together to enclose and define a vapor chamber 115, which contains a wick 150 and a working fluid 117. The cover 120 is coupled to the base 110 and/or the folded fin structure 130 to enclose and define a liquid coolant chamber 125 through which liquid coolant 143 may be flowed. The liquid coolant 142 may be supplied by a liquid cooling loop, not illustrated, to which the cold plate 100 may be fluidically coupled during usage. Those of ordinary skill in the art would understand that the liquid coolant 143 may not be present in the cold plate 100 in certain states, such as prior to the cold plate 100 being coupled into a liquid cooling loop. (A cold plate coupled to the liquid cooling loop may also be referred to herein as being a part of the liquid cooling loop). The folded fin structure 130 forms part of the boundary of the vapor chamber 115 and part of the boundary of the liquid coolant chamber 125, with the folded fin structure 130 separating the vapor chamber 115 from the liquid coolant chamber 125.

The base 110, folded fin structure 130, wick 150 and working fluid 117 together form a vapor chamber device 160. The vapor chamber device 160 transfers heat from the base 110 to the folded fin structure 130 by the working fluid 117 repeatedly going through a phase change cycle of vaporization, convection, condensation, and wicking. In particular, the working fluid 117 in a liquid state absorbs heat from the base 110 (which may be thermally coupled to a heat source) until becoming vaporized, the working fluid 117 in vapor form then flows to the folded fin structure 130 via convection, the working fluid 117 in vapor form then contacts the folded fin structure 130 and condenses thereon (thus releasing heat into the folded fin structure 130), and the now-liquid working fluid 117 then flows back to the base 110 via wicking through the wick 150 to start the cycle again.

The working fluid 117 may be any fluid capable of going through the above-described phase change cycle at the desired operating temperatures of the components (i.e., a fluid capable of vaporizing at the desired operating temperatures of the component the cold plate 100 is to cool and capable of condensing at the desired temperatures of the liquid coolant 143). Examples of suitable working fluids include, but are not limited to, water, methanol, Dowtherm, and acetone. The wick 150 may comprise any structure or combination of structures that provide for movement of the working fluid 117 in liquid form, for example via capillary action. For example, the wick 150 may be formed by a sintered powder coating on the surface of the base 110 that faces the vapor chamber 115, by grooves formed in the surface of the base 110 that faces the vapor chamber 115, by a rigid structure comprising grooves inserted within the vapor chamber 115, by a screen, mesh, fibers, or other porous materials inserted within the vapor chamber 115, or similar types of wicking mechanisms known to those of ordinary skill in the art. In some cases, the wick 150 may be integrally coupled with the base 110, while in other cases the wick 150 may be a separate and distinct piece from the base 110.

The folded fin structure 130 comprises a plurality of folded fins 131 (only one is labeled in FIG. 1) which are coupled together to form a corrugated shape with a first corrugated surface facing into the vapor chamber 115 and a second corrugated surface facing into the liquid coolant chamber 125. The folded fins 131 have a longitudinal dimension that extends perpendicular to the page in FIG. 1, a height dimension 139, and a lateral dimension 138. Each folded fin 131 comprises a pair of lateral walls 133 and an end portion 134. The lateral walls 133 face generally in a lateral direction, meaning the faces of the lateral walls 133 are approximately perpendicular to the lateral dimension 138. In other words, the faces of the lateral walls 133 extend generally in (i.e., are approximately parallel to) a plane comprising the height dimension 139 and the longitudinal dimension of the folded fins 131. However, the lateral walls 133 can be angled somewhat relative to the height dimension 139 (e.g., +/−45°) and thus are not necessarily perfectly parallel thereto. The lateral walls 133 are spaced apart from one another along the lateral dimension 138. The pair of lateral walls 133 of a given folded fin 131 are coupled together by the first end portion 134 of the folded fin 131, with the first end portion 134 being located at one end of the folded fin 131. A pair of adjacent folded fins 131 are coupled together by a second end portion 135 located at respective ends of the two folded fins 131 opposite from their respective first end portions 134, as shown in FIG. 1. Although shown schematically in FIG. 1 as being flat, the end portions 134 and 135 may be curved, flat, angled, pointed, or combinations thereof. In some examples, the end portions 134 and 135 are integrally coupled to the lateral walls 133 and comprise one or more bent, curved, and/or folded sections forming a transition between the lateral wall 133 and the end portion 134 or 135.

The folded fins 131 define a first set of grooves 141 (only one labeled in FIG. 1) on a first side of the folded fin structure 130 facing the base 110 (the "base side"). Each groove of the first set of grooves 141 is defined by and between the lateral walls 133 and the first end portion 134 of one of the folded fins 131. The first set of grooves 141 are part of the vapor chamber 115, or in other words the vapor chamber 115 extends into the first set of grooves 141. Thus, a corrugated surface of the folded fin structure 130 facing the base 110, which includes surfaces of the lateral walls 133 and both the end portions 133 and 134, is exposed directly to the vapor chamber 115. Consequently, the working fluid 117 in vapor form can contact and condense directly on these surfaces, and the above-described transfer of heat by the working fluid 117 into the folded fin structure 130 thus includes the transfer of heat by the vapor directly into the folded fins 131, including directly into the lateral walls 133 and end portions 135 thereof, via condensation thereon.

The folded fins 131 also define a second set of grooves 142 (only one labeled in FIG. 1) on a second side of the folded fin structure 130 facing the cover 120 (the "cover side"). Each groove 142 of the second set of grooves 142 is defined by two lateral walls 133 of a pair of adjacent folded fins 131 and by the second end portion 135 coupling those two lateral walls 133 together. The second set of grooves 142 are part of the liquid coolant chamber 125, or in other words the liquid coolant chamber 125 extends into the second set of grooves 142, and therefore liquid coolant flowing through the liquid coolant chamber 125 can contact the surfaces of the folded fins 131 on the cover side of the folded fin structure 130. Thus, a second corrugated surface of the folded fin structure 130 facing the cover 120, which includes surfaces of the lateral walls 133 and the end portions 135, is exposed directly to the liquid coolant chamber 125. Thus, the heat transferred into the folded fins 131 can be removed from the folded fins 131 via conduction into the liquid coolant 143 coming into contact with the cover side surfaces of the folded fins 131.

The folded fin structure 130 may be formed from one or more thermally conductive materials, including in some cases a highly thermal conductive material. For example, in some implementations the folded fin structure 130 is made from a metal, such as copper, a copper alloy (such as a copper-beryllium alloy, a copper-zirconium alloy, etc.), stainless steel, or aluminum.

The folded fin structure 130 can be formed from a single sheet of material (e.g., metal) that has been formed (e.g., folded) to obtain a corrugated shape with the plurality of folded fins 131. Alternatively, the folded fin structure 130 can be formed from separate pieces that are joined together (e.g., by welding, soldering, mechanical fastening techniques, etc.); for example, discrete sections comprising one folded fin 131 or a subset of integrally coupled folded fins 131 may be formed separately and then joined together to form the corrugated shape. The folded fin structure 130 can alternatively be formed by a variety of other techniques, including, but not limited to, machining one or more pieces of material, for example by cutting (or other material removal process) the grooves 141 and 142 into a solid block of material, extrusion, and/or additive manufacturing techniques, such as 3D printing.

The base 110 can similarly be formed from one or more thermally conductive materials, including in some cases a highly thermal conductive material. For example, the base 110 may be formed from a metal such as copper, a copper alloy, stainless steel, nickel plated brass, etc.

The cover 120 can be formed from any desired material that is suitable for exposure to the liquid coolant 143. For example, the cover 120 may be from a polymer or plastic such as Polyphenylene sulfide (PPS), glass-filled PPS, Polyphenylsulfone (PPSU), Noryl, or other similar materials.

The folded fin vapor chamber cold plate 100 may be formed by forming the vapor chamber device 160 and then attaching the cover 120 thereto. The vapor chamber device 160 may be formed by joining the base 110 to the folded fin structure 130 with the wick 150 and the working fluid 117 in the vapor chamber 115. For example, the base 110 may be provided (e.g., manufactured, purchased, etc.) and the wick 150 may be positioned on the base 110 at a portion thereof which will ultimately become part of the vapor chamber 115. Positioning the wick 150 on the base 110 may comprise forming the wick 150 on the base 110 in some cases (e.g., depositing powder on the base 110 and sintering the powder to form the wick 150). In other cases, positioning the wick 150 on the base 110 may comprise providing a separately formed wick 150 and placing that wick 150 on the base 110. The working fluid 117 may also be disposed on the base 110, for example on and/or in the wick 150. Then the folded fin structure 130 may be positioned over and brought into contact with the base 110. In this state, the base 110 and the folded fin structure 130 may then be affixed together by, for example, brazing (e.g., soldering), welding, mechanical joining (e.g., crimping), adhesives, or any other joining process that can create a vapor and liquid tight seal to prevent egress of the working fluid 117 from the vapor chamber 115. Alternatively, instead of placing the working fluid 117 on the base 110 prior to joining the folded fin structure 130 to the base 110, the working fluid 117 may be injected into the vapor chamber 115 after joining of the folded fin structure 130 to the base 110 via an opening that is formed in the base 110 or folded fin structure 130 and then this opening may thereafter be sealed, for example by adding a material such as solder or adhesive into the opening, by melting the material around the opening to close the opening, or by mechanically sealing the opening such as by crimping the material around it. Once the vapor chamber device 160 is formed, the cover 120 can be affixed to the vapor chamber device 160 by adhesives, mechanical fasteners, or any other desired joining process. A gasket (not illustrated) may be used between the cover 120 and the vapor chamber device 160 to help create a liquid tight seal.

Turning now to FIGS. 2-5, a heat removal apparatus in the form of a folded fin vapor chamber cold plate 200 (also referred to as "cold plate 200") in accordance with various aspects of the disclosure will be described. The cold plate 200 may be one configuration of the cold plate 100 described above. Thus, various components of the cold plate 200 may be similar to components of the cold plate 100 described above. The above descriptions of components of the cold plate 100 are applicable to the similar components of the cold plate 200, and thus duplicative descriptions are omitted below to improve clarity. Similar components of the cold plates 100 and 200 are given reference numbers having the same last two digits, such as 110 and 210. Although the cold plate 200 may be one configuration of the cold plate 100, the cold plate 100 is not limited to the configuration of cold plate 200.

Various elements of the cold plate 200 or components thereof are illustrated in multiple figures. As elements are described below, one or a few figures which are thought to be particularly pertinent to the element being described will be noted, and thus the description below will not necessarily describe FIGS. 2-5 separately and in strict sequence but will instead move back and forth between various figures. In addition, it should be understood that when certain figures are referred to in relation to a particular element, other figures besides those that are identified may also illustrate the same part from other perspectives.

Figure 2:
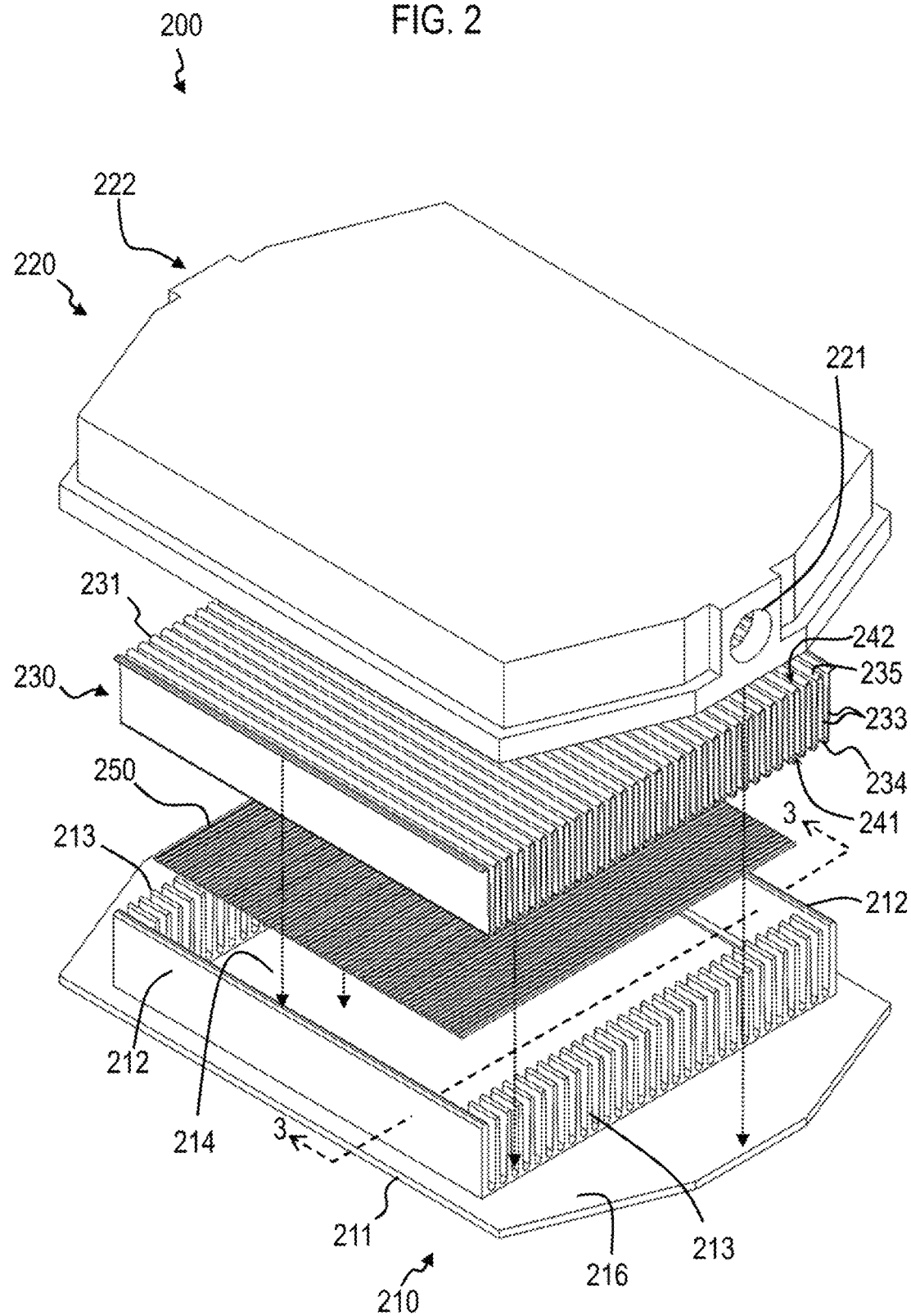
FIG. 2 is an exploded perspective view of a folded fin vapor chamber cold plate.
Figure 3:
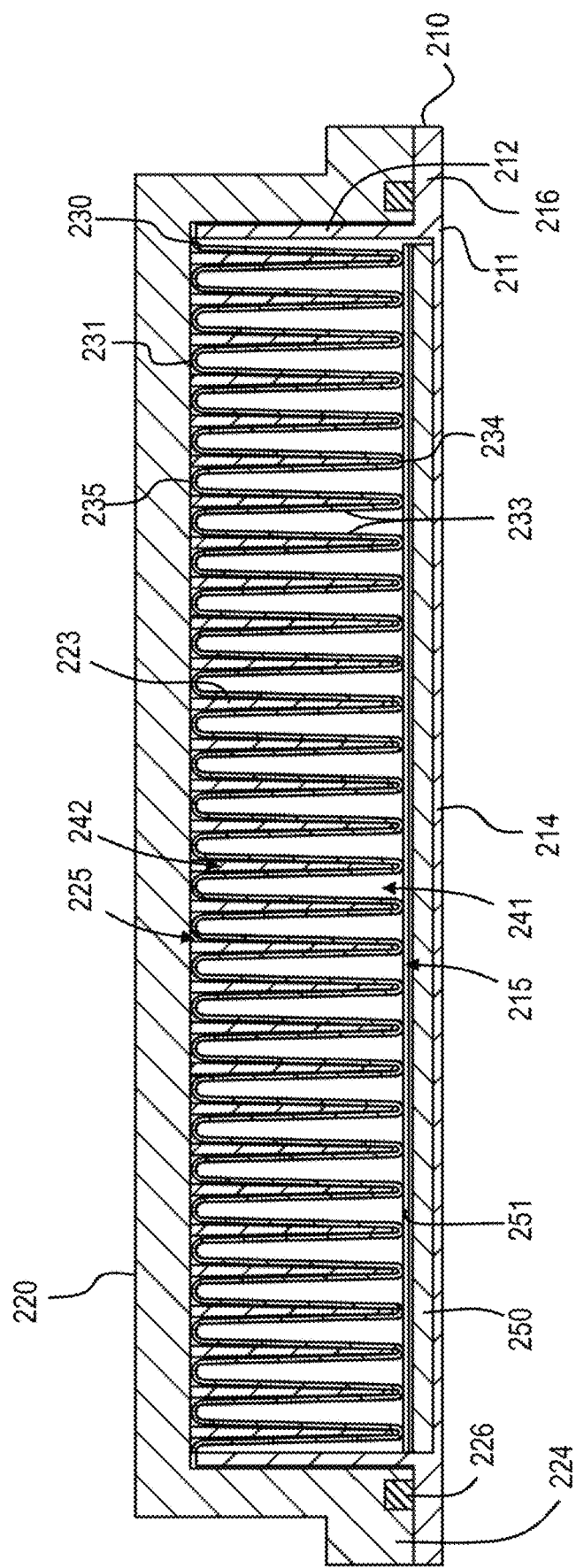
FIG. 3 is a cross section of the folded fin vapor chamber cold plate of FIG. 2 with the section taken along 3-3 in FIG. 2.

As shown in FIG. 2, the folded fin vapor chamber cold plate 200 comprises a base 210, a folded fin structure 230, and a cover 220. As shown in FIGS. 2 and 3, the base 210 is coupled to the folded fin structure 230 to define a vapor chamber 215 therebetween, as described above in relation to the cold plate 100. A wick 250 and a working fluid (not illustrated) are disposed in the vapor chamber 215, with the base 210, folded fin structure 230, wick 250 and working fluid forming a vapor chamber device. The cover 220 is coupled to the base 210, and the cover 220 and the folded fin structure 230 define a liquid coolant chamber 225 therebetween, as described above. A portion of the base 210 may also form part of the boundary of the liquid coolant chamber 225.

As shown in FIG. 2, the folded fin structure 230 comprises a plurality of folded fins 231. Each folded fin comprises lateral walls 233, with end portions 234 and 235 which couple adjacent lateral walls 233 together. The folded fins 231 define a first set of grooves 241 on a side thereof facing the base 210 and a second set of grooves 242 on a side thereof facing the cover 220. The folded fin structure 230 may be formed as described above in relation to the folded fin structure 130.

In the example of FIGS. 2-5, the wick 250 comprises a rigid body, such as a body formed by sintered metal powder, a rigid wire mesh, a solid body with grooves formed therein, etc. The wick 250 may be integrally coupled to the base 210 in some cases. For example, the wick 250 may be formed via sintering directly onto the base 210, in which case the wick 250 may be coupled to the base. In other cases, the wick 250 may be formed separately from the base 210, for example via sintering, additive manufacturing, etc. In some implementations, the wick 250 also includes grooves 251 that extend perpendicular to the folded fins 231 (see FIG. 3), with the grooves allowing vapor to travel across in directions perpendicular to the folded fins 231 so that the vapor can be distributed more evenly among the grooves 241.

As shown in FIG. 2, the base 210 comprises a planar portion 211 and engagement portions 212 and 213 coupled to and extending perpendicularly from the planar portion 211. The planar portion 211 may be thermally coupled with a heat generating component, such as a processor of a computer, such as by thermally coupling the external face (bottom face in the orientation of FIG. 3) of the planar portion 211 to the heat generating component in a manner similar to that described further below with reference to FIG. 7. The engagement portions 212 and 213 are configured to engage with the folded fin structure 230 and are described in greater detail below. The base 210 may be formed as one unitary body, for example by machining a piece of metal, by casting, by additive manufacturing, and/or by other similar process. Alternatively, the base 210 may be formed as separate parts that are later coupled together. For example, the engagement portions 213 may be formed by extrusion or machining and the planar portion 211 and the engagement portion 212 may be formed from plates or sheets of metal, and these components may be coupled together by any suitable jointing technique (e.g., brazing, welding, adhesives, and other similar joining techniques).

The engagement portions 212 comprise two opposing walls that engage with the two outermost folded fins 231 of the folded fin structure 230, as shown in FIGS. 2 and 3. The engagement portions 213 each comprise a row of plugs extending between the engagement portions 212, with the plugs being configured to interleave with the folded fins 231 of the folded fin structure 230 when the folded fin structure 230 is coupled to the base 210. The plugs have substantially the same size and shape in profile as the grooves 241 but are much shorter in the longitudinal direction, and thus each plug fills and plugs (blocks off) one end section of a corresponding groove 241 when engaged with the folded fin structure 230 while leaving a middle section of the groove 241 open. Thus, when the engagement portions 212 and 213 are affixed to the folded fins 231 (e.g., by brazing or other joining methods, as described above in relation to the cold plate 100), they create a seal all around the perimeter of the folded fin structure 230 (e.g., the engagement portions 212 sealing lateral sides of the folded fin structure 230 and the engagement portions 213 sealing the ends of the folded fins 231), thus completely sealing the vapor chamber 215 relative to an exterior environment and preventing egress of the working fluid therefrom.

As shown in FIGS. 2 and 3, the planar portion 211 of the base 210 may comprise an outer flange portion 216 that extends beyond the engagement portions 212 and 213. The outer flange portion 216 may engage with a flange portion 224 of the cover 220, as shown in FIG. 3. A gasket 226 may be disposed between the outer flange portion 216 and the flange portion 224 to provide a liquid tight seal for the liquid coolant chamber 225, as shown in FIG. 3.

As shown in FIG. 3, the planar portion 211 of the base 210 may also comprise a middle portion 214, which may be thinner in a thickness dimension than a remainder of the planar portion 211. The middle portion 214 may be what is placed into contact with a component to be cooled, and the middle portion 214 may be thinned so as to reduce the distance heat must travel as it is conducted from a surface of the base 210 facing the component to be cooled through the base 210 to a surface of the base 210 facing into the vapor chamber 215. By reducing the distance heat is conducted while passing through the base 210, a rate of heat transfer through the base 210 can be increased. Making a contacting surface of a cold plate, such as the middle portion 214, relatively thin might not be feasible in many cold plates because such a thin contacting surface may not have sufficient rigidity and strength to withstand the forces involved with installation on a component to be cooled. However, in the folded fin vapor chamber cold plate 200 the middle portion 214 can be relatively thin without making it structurally unsound because other elements of the cold plate 200 are configured to provide structural support to the middle portion 214 to help make up for the reduction in its rigidity and strength that otherwise occurs due to being thinned. In particular, as shown in FIG. 3, one side of the wick 250 is disposed in contact with the middle portion 214. In this implementation, the wick 250 comprises a rigid body, and thus the wick 250 being in contact with the middle portion 214 is able to lend some support thereto. Moreover, the wick 250 is also in contact with the end portions 234 of the folded fin structure 230 (i.e., with a bottom side of the folded fin structure 230 in the orientation shown in FIG. 3). As a result, the folded fin structure 230 can lend further structural support to the thinner middle portion 214 of the base 210, via the mutual contact of the folded fin structure 230 and the middle portion 214 with the wick 250. Thus, the wick 250 and the folded fin structure 230 provide the middle portion 214 with sufficient support to allow it to withstand the forces associated with installation of the cold plate 200 on a component, despite the middle portion 214 potentially being unable to withstand such forces on its own. Thus, not only does the folded fin structure 230 facilitate high heat transfer rates through the cold plate 200 by virtue of replacing certain slow conduction paths with faster vapor heat transfer (e.g., omitting conduction along the height dimension of the fins as occurs in other cold plates), but the folded fin structure 230 may also help to facilitate high heat transfer rates by allowing the middle portion 214 to be relatively thin and thus exhibit improved conduction of heat through the base 210 into the vapor chamber 215.

Figure 4:
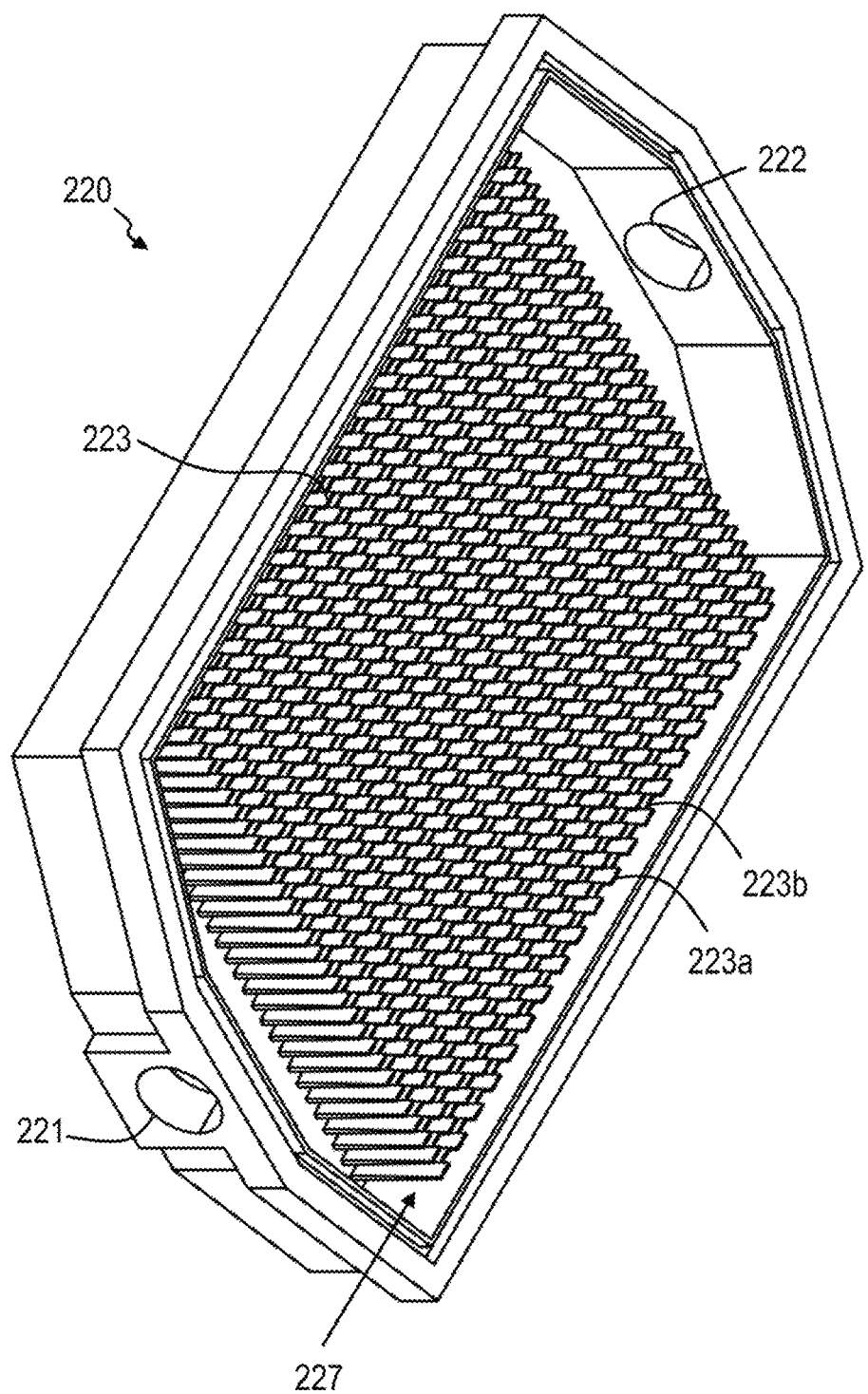
FIG. 4 is a perspective view of a bottom side of a cover of the folded fin vapor chamber cold plate of FIG. 2.

As shown in FIGS. 2 and 4, the cover 220 comprises an inlet 221 and an outlet 222 that communicably connect the liquid coolant chamber 225 to an exterior environment. The inlet 221 and outlet 222 may be coupled into liquid coolant supply and return lines, respectively, of a liquid cooling loop to provide a flow of liquid coolant through the chamber 225.

Figure 5:
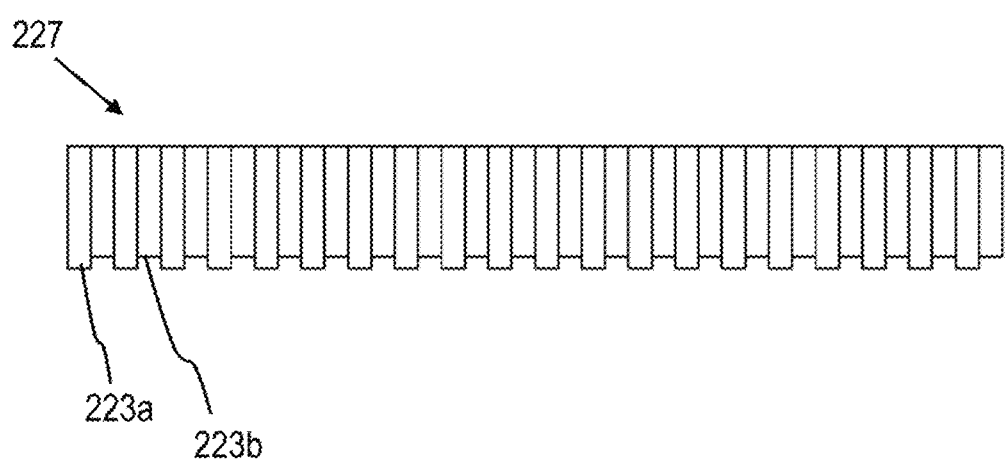
FIG. 5 is a side view of a row of turbulators of the folded fin vapor chamber cold plate of FIG. 2.

As shown in FIGS. 3-5, the cover 220 also comprises a plurality of turbulators 223. In the example illustrated in FIGS. 3-5, the turbulators 223 comprise blade-like protrusions that extend from the cover down into the second set of grooves 242 defined by the folded fins 231 on the cover-facing side of the folded fin structure 230. As shown in FIG. 4 the turbulators 223 are arranged in rows 227, with each row 227 protruding into a corresponding one of the grooves 242. FIG. 5 illustrates a side view of one such row 227. As shown in FIGS. 4 and 5, the turbulators 223 may have varying heights so as to further increase turbulence. For example, as shown in FIGS. 4 and 5 the turbulators 223 may include a first subset of long turbulators 223a and a second subset of short turbulators 223b which alternate one with another along a given row 227 (e.g., along the length of a groove 242 into which they extend). As shown in FIG. 3, the turbulators 223 may taper in width, going from a widest part at an end thereof attached to the cover 220 to a narrowest part at a free end thereof. In some implementations, the turbulators 223 may be formed integrally with the cover 220. For example, the cover 220 and the turbulators 223 may be formed by molding (e.g., injection molding), casting, or additive manufacturing.

Figure 6:
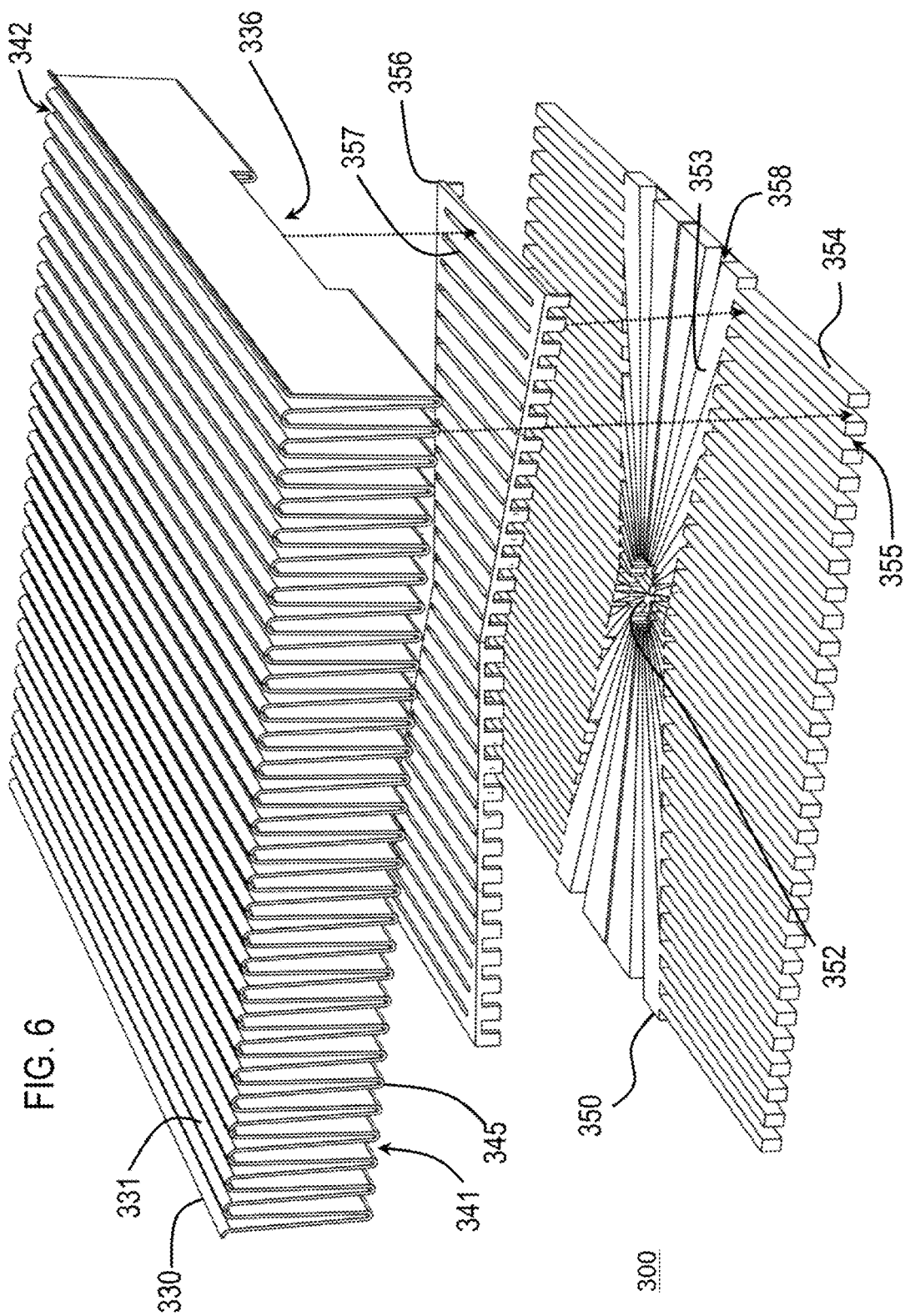
FIG. 6 is an exploded perspective view of another folded fin vapor chamber cold plate.

Turning now to FIG. 6, another implementation of a heat removal apparatus in the form of a folded fin vapor chamber cold plate 300 (also referred to as "cold plate 300") is described. The cold plate 300 may be one configuration of the cold plate 100 described above. Moreover, the cold plate 300 may be similar to the cold plate 200 described above, except for some differences which are noted below. Thus, various components of the cold plate 300 may be similar to components of the cold plates 100 and 200 described above. The above descriptions of components of the cold plate 100 and 200 are applicable to the similar components of the cold plate 300, and thus duplicative descriptions are omitted below to improve clarity. Although the cold plate 300 may be one configuration of the cold plate 100, the cold plate 100 is not limited to the cold plate 300.

As shown in FIG. 6, the cold plate 300 comprises a wick 350 and a folded fin structure 330. The cold plate also comprises a base similar to the base 210 described above, which is omitted from the view in FIG. 6 to improve clarity.

The cold plate 300 may also comprise a cover similar to the covers 120 or 220, which is omitted from the view in FIG. 6 to improve clarity.

The folded fin structure 330 may be used as the folded fin structure 130. The folded fin structure 330 may also be similar to the folded fin structure 230 described above, and duplicative description of similar aspects is omitted below. A difference between the folded fin structure 230 and the folded fin structure 330 is that the folded fin structure 330 comprises a raised section 336 on a side thereof, which is described in greater detail below.

The wick 350 may be used as the wick 150. As shown in FIG. 6, the wick 350 comprises a central region 352, a number of first wick segments 353, and a number of second wick segments 354 arranged in a pattern. In particular, first wick segments 353 extend in radial directions from the central region 352, whereas second wick segments 354 extend from the first wick segments 353 in directions parallel to folded fins 331 of the folded fin structure 330. Between adjacent first wick segments 353 are open channels 358, and between adjacent second wick segments are open channels 355. Outside of the raised section 336, the bottom sides of the folded fins 331 may be positioned within the channels 355 defined between adjacent second wick segments 354. Within the raised section 336, the bottom sides of the folded fins 331 are elevated above the first wick segments 353 and above a regulator plate 356 (described further below).

The central region 352 is located near a middle of the base 310, which is generally positioned adjacent to the hottest part of the component to be cooled, and therefore a disproportionate amount (e.g., a majority in some cases) of the vapor produced is expected to be produced in or near the central region 352. Thus, the patterns of the first and second wick segments 353 and 354 and the channels 355 and 358 are designed to promote more uniform circulation of vapor generated near the central region 352 among all of the grooves 341 of the folded fins 331. In addition, the patterns of the first and second wick segments 353 and 354 and the channels 355 and 358 are designed to also provide efficient return wicking paths that guide the condensed liquid back toward the central region 352 so as to ensure a continual supply of liquid to be vaporized and consequently increase heat transfer.

Specifically, the channels 358 defined between the first wick segments 353 extend in radial directions from the central region 352, and these channels 358 allow the vapor generated in the central region 352 to travel in directions generally perpendicular to the folded fins 331. This allows the vapor to reach grooves 341 that are more distant from the central region 352 instead of all being directed straight up into the grooves 341 directly above the central region 352. In addition, a regulator plate 356 may be positioned over the channels 358 to restrict the rate of vapor entering the grooves 341 from the channels 358. The regulator plate 356 may be configured so as to facilitate a more even spread of the vapor across all of the grooves 341. For example, as shown in FIG. 6 the regulator plate 356 comprises slots 357 that are aligned with the grooves 341 and through which the vapor is allowed to enter the grooves 341, and the slots 357 increase in length based on their distance from the central region 352 (slots 357 that are farther away being longer). This lengthening of the slots 357 that are farther from the central region 352 tends to encourage more even distribution of the vapor among the grooves 341 because the vapor pressure may be higher nearer to the central region 352 and therefore a shorter slot 357 near to the central region 352 may produce a similar flow rate of vapor as a longer slot 357 would farther from the central region 352. The vapor once it enters the grooves 341 may then expand along the longitudinal dimension of the grooves 341 and contact and condense along most (if not all) of the surfaces of the folded fins 331. Thus, heat may be relatively evenly distributed across the folded fins 331. After the working fluid has condensed, it falls down the sides of the folded fins 331 until it reaches the wick segments 353 or 354 positioned below or within the grooves 341. The wick segments 353 move the liquid in a longitudinal direction to the wick segments 354, and the wick segments 354 move the liquid in radial directions back to the central region 352. The returned liquid is then heated and vaporized, starting the cycle again. Of course, it should be understood that the central region 352 is not the only place where vaporization occurs, and some of the liquid being moved through the wick segment 353 and 354 may be vaporized prior to being returned to the central region 352. However, the description above focuses on the vapor generated in the central region 352 because this is where a disproportionate amount of the vapor is expected to be generated, as already noted above.

Figure 7:
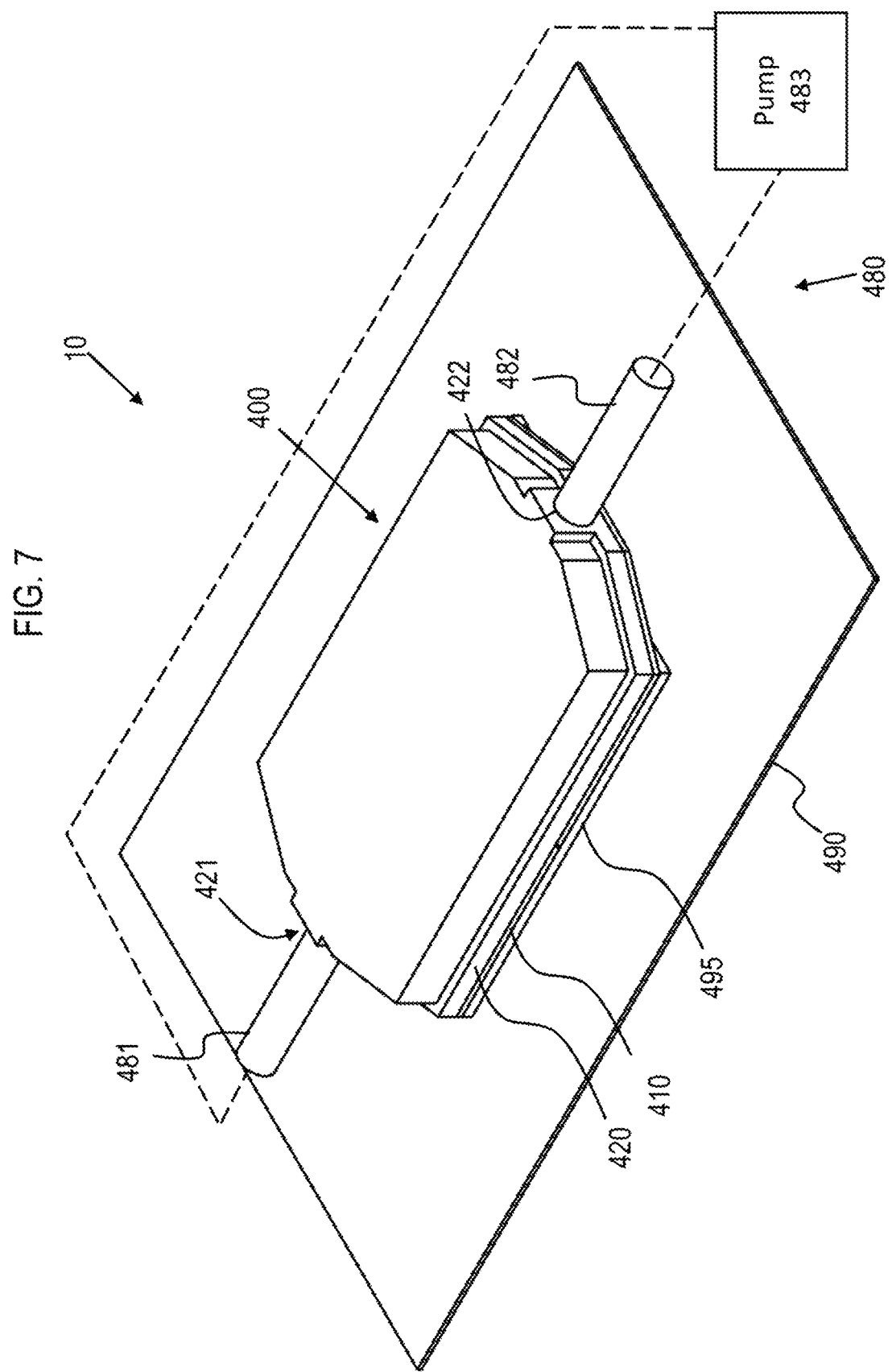
FIG. 7 is a perspective view of a system comprising a folded fin vapor chamber cold plate.

Turning now to FIG. 7, a system 10 utilizing a folded fin vapor chamber cold plate will be described. The system 10 comprises an electronic device 490 comprising a heat generating component 495. The electronic device 490 may be a computer (e.g., a node of a computing system), a networking device, a power supply device, or any other type of electronic device. The heat generating component 495 may be any electronic circuitry that generates heat, such as a processor, a hardware accelerator, a controller, a switching unit, or any other electronic component.

As shown in FIG. 7, the system 10 further comprises a liquid cooling loop 480. The liquid cooling loop 480 comprises a folded fin vapor chamber cold plate 400, a liquid supply line 481, and a liquid return line 482. The folded fin vapor chamber cold plate 400 may comprise any of the cold plates 100, 200, or 300 described above, and comprises a base 410 and a cover 420 coupled to the base. The cold plate 400 may further comprise a folded fin structure, which is not visible in FIG. 6, in accordance with any of the configurations described above. As shown in FIG. 6, the base 410 is thermally coupled to the heat generating component 495. The base 410 may be directly in contact with the heat generating component 495, or may be indirectly in contact with the heat generating component 495 via one or more thermally conductive intermediaries, such as a thermal interface material (TIM) or an integrated heat spreader (IHS) of the heat generating component 495. The cover 420 (together with the folded fin structure) defines a liquid coolant chamber (not visible), and has an inlet 421 and an outlet 422 to allow fluid communication with the liquid coolant chamber. The liquid supply line 481 and liquid return line 482 are connected to the inlet 421 and the outlet 422, respectively, in the cover 420 such that the lines 481 and 482 can deliver a flow of liquid coolant into and through the liquid coolant chamber of the cold plate 400. The liquid supply line 481 and liquid return line 482 are also coupled to a remainder of the liquid cooling loop 480, which comprises a pump 483 to cause the liquid coolant to circulate through the lines 481 and 482. The liquid cooling loop 480 may also comprise one or more additional components (not illustrated), such as a heat exchanger to cool the liquid coolant, additional cold plates to cool other devices, valves, fittings, and/or other component(s) common to liquid cooling loops as would be familiar to those of ordinary skill in the art.

In some implementations, as the flow of liquid coolant is supplied through the liquid chamber, a pressure drop of the flow of liquid between the supply and return lines 481 and 482 is less than or equal to 1 psi (6.9 kPa). Furthermore, in some implementations the cold plate 400 has a thermal resistance of no more than 0.01 C/W, where thermal resistance refers to the difference between the temperature of the component to be cooled and the temperature of the liquid coolant at the inlet of the cold plate 400 (also referred to as the temperature delta) all divided by the rate at which the cold plate 400 can remove heat from the component to be cooled under the aforementioned temperature conditions. The thermal resistance generally reflects the efficiency of the cold plate 400 at removing heat at a given temperature delta, with lower values being generally better than higher values. The thermal resistance can be interpreted as indicating how much heat the cold plate 400 can remove at specified liquid coolant and component operating temperatures (i.e., at a specified temperature delta), or alternatively can be interpreted as indicating the lowest temperature delta that can be used while still allowing the cold plate 400 to achieve a specified rate of heat removal (lower temperature deltas being desired in some contexts because it may allow for less energy to be spent on cooling the liquid coolant).

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry. In some cases, certain electronic circuitry may comprise processing circuitry. Processing circuitry comprises circuitry configured with logic for performing the various operations. The logic of the processing circuitry may comprise dedicated hardware to perform various operations, software (machine readable and/or processor executable instructions) to perform various operations, or any combination thereof. In examples in which the logic comprises software, the processing circuitry may include a processor to execute the software instructions and a memory device that stores the software. The processor may comprise one or more processing devices capable of executing machine readable instructions, such as, for example, a processor, a processor core, a central processing unit (CPU), a controller, a microcontroller, a system-on-chip (SoC), a digital signal processor (DSP), a graphics processing unit (GPU), etc. In cases in which the processing circuitry includes dedicated hardware, in addition to or in lieu of the processor, the dedicated hardware may include any electronic device that is configured to perform specific operations, such as an Application Specific Integrated Circuit (ASIC), a Field Programmable Gate Array (FPGA), a Complex Programmable Logic Device (CPLD), discrete logic circuits, a hardware accelerator, a hardware encoder, etc. The processing circuitry may also include any combination of dedicated hardware and processor plus software.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

Further, spatial, positional, and relational terminology used herein is chosen to aid the reader in understanding examples of the invention but is not intended to limit the invention to a particular reference frame, orientation, or positional relationship. For example, spatial, positional, and relational terms such as "up", "down", "lateral", "beneath", "below", "lower", "above", "upper", "proximal", "distal", and the like may be used herein to describe directions or to describe one element's or feature's spatial relationship to another element or feature as illustrated in the figures. These spatial terms are used relative to reference frames in the figures and are not limited to a particular reference frame in the real world. Thus, for example, the direction "up" in the figures does not necessarily correspond to an "up" in a world reference frame (e.g., away from the Earth's surface). Furthermore, if a different reference frame is considered than the one illustrated in the figures, then the spatial terms used herein may need to be interpreted differently in that different reference frame. For example, the direction referred to as "up" in relation to one of the figures may correspond to a direction that is called "down" in relation to a different reference frame that is rotated 180 degrees from the figure's reference frame. As another example, if a device is turned over 180 degrees in a world reference frame as compared to how it was illustrated in the figures, then an item described herein as being "above" or "over" a second item in relation to the Figures would be "below" or "beneath" the second item in relation to the world reference frame. Moreover, the poses of items illustrated in the figure are chosen for convenience of illustration and description, but in an implementation in practice the items may be posed differently.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

Cold Plate: As used herein, "cold plate" refers to a device that receives heat from a solid body via conduction (contact) and dissipates that heat into liquid coolant of a liquid cooling loop.

Thermally Coupled: As used herein, to "thermally couple" two objects means to provide a thermally conductive pathway between the objects that allows heat to be conducted between the objects. Two objects may be considered to be thermally coupled if any of the following are true: (1) the two objects are in contact with one another (either direct contact, or contact via a TIM), (2) the objects are both thermally coupled to a thermally conductive intermediary (e.g., a heat pipe, heat spreader, etc.) (or to a chain of thermally conductive intermediaries thermally coupled together), or (3) a heat transfer coefficient between the two objects is 10 W·m$^{-2}$·K$^{-1}$ or greater.

Thermally conductive: An object, device, or assembly (which may comprise multiple distinct bodies that are thermally coupled, and may include multiple different materials), is "thermally conductive" between two thermal interfaces if any one of the following is true: (1) a heat transfer coefficient between the thermal interfaces is 10 W·m$^{-2}$·K$^{-1}$ or greater at any temperature between 0° C. and 100° C., (2) the object is a continuous piece of a material that has a thermal conductivity (often denoted k, λ, or κ) between the two interfaces of 1 W·m$^{-1}$·K$^{-1}$ or greater at any temperature between 0° C. and 100° C., (3) the object is a heat pipe, vapor chamber, continuous body of copper, or continuous body of aluminum. Examples of materials whose thermal conductivity is greater than 1 W·m$^{-1}$·K$^{-1}$ between 0° C. and 100° C. include almost all metals and their alloys (e.g., copper, aluminum, gold, etc.), some plastics (e.g., TECACOMP® TC compounds, CoolPoly® D-series Thermally Conductive Plastics), and many other materials.

Highly thermally conductive: An object, device, or assembly (which may comprise multiple distinct bodies that are thermally coupled, and may include multiple different materials), is "highly thermally conductive" between two thermal interfaces if any one of the following is true: (1) a heat transfer coefficient between the thermal interfaces is 1000 W·m$^{-2}$·K$^{-1}$ or greater at any temperature between 0° C. and 100° C., (2) the object is a continuous piece of a material that has a thermal conductivity (often denoted k, λ, or κ) between the two interfaces of 100 W·m$^{-1}$·K$^{-1}$ or greater at any temperature between 0° C. and 100° C., (3) the object is a heat pipe, vapor chamber, continuous body of copper, or continuous body of aluminum. Examples of materials whose thermal conductivity is 100 W·m$^{-1}$·K$^{-1}$ or greater between 0° C. and 100° C. include certain types of copper, aluminum, silver, and gold.

Longitudinal: As used herein, longitudinal refers to a direction that is parallel to the folded fins, i.e., parallel to a direction of greatest extent of an individual folded fin (and also parallel to the grooves defined by the folded fins). Thus, a longitudinal dimension of the folded fin structure is a dimension thereof that is parallel to the direction of extent of each individual folded fin thereof, which can be but does not necessarily have to be the longest dimension of the overall folded fin structure.

Lateral: As used herein, lateral refers to a direction that is perpendicular to longitudinal and height dimensions of the folded fins, wherein the height dimension is a dimension of second greatest extent of the folded fins.

Provide: As used herein, to "provide" an item means to have possession of and/or control over the item. This may include, for example, forming (or assembling) some or all of the item from its constituent materials and/or, obtaining possession of and/or control over an already-formed item.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. A heat removal apparatus, comprising:
    a vapor chamber device comprising:
        a base, and
        a folded fin structure coupled to the base, the base and folded fin structure defining a vapor chamber containing a wick and a working fluid;
    a cover coupled to the vapor chamber device, the cover and vapor chamber device defining a liquid chamber configured to receive liquid coolant; and
    a plurality of turbulators disposed in the liquid chamber, the turbulators comprise a first subset of turbulators having a first length and a second subset of turbulators having a second length different than the first length;
    wherein the folded fin structure comprises a plurality of folded fins defining a first plurality of grooves on a first side of the folded fin structure and defining a second plurality of grooves on a second side of the folded fin structure, wherein the first plurality of grooves are part of the vapor chamber, wherein the second plurality of grooves are part of the liquid chamber, and wherein within each groove of the plurality of second grooves, the first subset of turbulators and the second subset of turbulators alternate along the length of the respective groove.

2. The heat removal apparatus of claim 1, wherein each folded fin of the plurality of folded fins comprises a pair of lateral walls, and a first end portion coupling the lateral walls together, wherein adjacent folded fins of the plurality of folded fins are coupled together by a second end portion, and wherein the lateral walls, the first end portions, and the second end portions of the plurality of folded fins are exposed to the vapor chamber and to the liquid chamber.

3. The heat removal apparatus of claim 1, wherein the plurality of turbulators comprise blades coupled to the cover and extending into the second plurality of grooves.

4. The heat removal apparatus of claim 1, wherein the base comprises a planar portion and engagement portions coupled to and extending perpendicularly from the planar portion, the engagement portions defining lateral bounds of the vapor chamber, the planar portion comprising a middle portion and an outer portion, wherein the middle portion is thinner than the outer portion, and the wick comprises a rigid body in contact with the middle portion and the plurality of folded fins.

5. The heat removal apparatus of claim 1, wherein the wick comprises a central region, a plurality of first wick segments extending radially from the central region, and a plurality of second wick segments extending from the plurality of first wick segments parallel to the plurality of folded fins.

6. The heat removal apparatus of claim 1, wherein the base comprises a planar portion comprising a middle portion forming a bottom bound of the vapor chamber and an outer flange portion surrounding the middle portion outside of the vapor chamber, wherein the cover comprises a flange disposed opposite the outer flange portion of the base;

wherein the heat removal apparatus further comprises a gasket disposed between the flange of the cover and the outer flange portion of the base.

7. A system comprising:

electronic circuitry;

the heat removal apparatus of claim 1, wherein the base is thermally coupled to the electronic circuitry; and a liquid cooling loop fluidically coupled with the cover and configured to supply a flow of liquid through the liquid chamber.

8. The system of claim 7, wherein the cover comprises an inlet opening and an outlet opening, the inlet and outlet openings communicably connected to the liquid chamber, and wherein the liquid cooling loop comprises a supply line coupled to the inlet opening and a return line coupled to the outlet opening.

9. The system of claim 8, wherein the liquid cooling loop further comprises a pump configured to cause the flow of liquid to flow from the supply line through the liquid chamber to the return line.

10. The system of claim 9, wherein the liquid chamber is configured such that, on condition of the flow of liquid being supplied through the liquid chamber, a pressure drop of the flow of liquid between the supply and return lines is less than or equal to 1 psi.

11. The system of claim 7, wherein the heat removal apparatus has a thermal resistance of 0.01 C/W or less.

12. A method, comprising:

providing the heat removal apparatus of claim 1;

thermally coupling the base of the vapor chamber device to electronic circuitry; and flowing a liquid through the liquid chamber.

13. A heat removal apparatus, comprising:

a vapor chamber device comprising:
  a base,
  a folded fin structure coupled to the base, the base and folded fin structure defining a vapor chamber, and
  a wick structure disposed in the vapor chamber, the wick structure comprising a wicking material physically distinct from the base; and a cover coupled to the vapor chamber device, the cover and vapor chamber device defining a liquid chamber configured to contain liquid;

wherein the folded fin structure comprises a first corrugated surface defining a first plurality of grooves and a second corrugated surface opposite from the first corrugated surface and defining a second plurality of grooves, the first and second corrugated surfaces defining a plurality of folded fins extending in a first direction, wherein the first corrugated surface is exposed to the vapor chamber, wherein the second corrugated surface is exposed to the liquid chamber, and wherein the wick structure comprises: a central region, a plurality of first wick segments formed from the wicking material and extending radially from the central region, a plurality of first channels defined between the first wick segments, a plurality of second wick segments formed from the wicking material and extending from the plurality of first wick segments parallel to the first direction, and a plurality of second channels defined between the second wick segments, wherein at least some of the plurality of folded fins extend into at least some of the second channels such that, for at least some of the plurality of first wick segments, the respective first wick segment is disposed within a respective first groove of the first plurality of grooves.

14. The heat removal apparatus of claim 13, wherein the plurality of folded fins comprises a raised section in a region above the plurality of first wick segments, wherein a bottom end portion of each of the folded fins is elevated within the raised section relative to outside of the raised section.

15. The heat removal apparatus of claim 13, further comprising a regulator plate disposed over the plurality of first wick segments, the regulator plate comprising slits aligned respectively with the first plurality of grooves, the slits configured to regulate a flow of vapor into the first plurality of grooves.

16. The heat removal apparatus of claim 15, wherein respective lengths of the slits increase as respective distances of the slits from the central portion increase.

17. A heat removal apparatus, comprising:
a vapor chamber device comprising:
  a base comprising a planar portion and engagement portions coupled to and extending perpendicularly from the planar portion, wherein the planar portion comprises a middle portion and an outer portion, and
  a folded fin structure coupled to the engagement portions of the base, wherein the base and folded fin structure define a vapor chamber containing a wick and a working fluid, wherein the middle portion defines a bottom bound of the vapor chamber, the engagement portions define lateral bounds of the vapor chamber, and the folded fin structure defines a top bound of the vapor chamber; and
a cover coupled to the vapor chamber device, the cover and vapor chamber device defining a liquid chamber configured to receive liquid coolant;
wherein the folded fin structure comprises a plurality of folded fins defining a first plurality of grooves on a first side of the folded fin structure and defining a second plurality of grooves on a second side of the folded fin structure,
wherein the first plurality of grooves are part of the vapor chamber,
wherein the second plurality of grooves are part of the liquid chamber, and
wherein the middle portion is thinner than the outer portion.

18. The heat removal apparatus of claim 17, the wick comprises a rigid body in contact with the middle portion and the plurality of folded fins.

19. The heat removal apparatus of claim 17, wherein the cover comprises a flange disposed opposite the outer portion of the base, and
wherein the heat removal apparatus further comprises a gasket disposed between the flange of the cover and the outer flange portion of the base.

20. The heat removal apparatus of claim 17, wherein the engagement portions are coupled to the planar portion between the outer portion and the middle portion.

* * * * *